United States Patent
Hsiao et al.

(10) Patent No.: US 6,291,354 B1
(45) Date of Patent: Sep. 18, 2001

(54) METHOD OF FABRICATING A SEMICONDUCTIVE DEVICE

(75) Inventors: Hsi-Mao Hsiao, Hsinchu; Chun-Lung Chen, Tainan Hsien; H. C. Yu, Yi-Lan Hsien; Hsi-Chin Lin, Hsinchu Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/315,799

(22) Filed: May 21, 1999

(51) Int. Cl.[7] .................................................. H01L 21/302
(52) U.S. Cl. .......................... 438/701; 438/305; 438/592; 438/595; 438/655; 438/682; 438/696; 438/734; 438/714; 438/740
(58) Field of Search ..................... 438/305, 592, 438/595, 655, 682, 701, 696, 734, 714, 723, 724, 740

(56) References Cited
U.S. PATENT DOCUMENTS

| | | | |
|---|---|---|---|
| 4,981,810 | * 1/1991 | Fazar et al. ............................. | 437/44 |
| 5,021,353 | * 6/1991 | Lowrey et al. ........................ | 437/34 |
| 5,672,544 | * 9/1997 | Pan ....................................... | 437/200 |
| 5,731,236 | * 3/1998 | Chou et al. ........................... | 438/253 |
| 5,830,798 | * 11/1998 | Dennison et al. .................... | 438/297 |
| 6,001,690 | * 12/1999 | Chien et al. .......................... | 438/266 |
| 6,140,192 | * 10/2000 | Hyang et al. ......................... | 438/305 |

* cited by examiner

Primary Examiner—Gregory Mills
Assistant Examiner—George Goudreau
(74) Attorney, Agent, or Firm—Jiawei Huang; J.C. Patents

(57) ABSTRACT

A method of fabricating a semiconductor device is described in which an insulation layer is formed over the gate electrode and the substrate. This insulation layer is anisotropically etched away except for a portion surrounding the sidewall of the gate electrode to form a spacer. The tip of the spacer is at the same height as the upper surface of the liner layer and is lower than the upper surface of the gate electrode, therefore, resulting in an increase of the exposed area of the gate electrode surface.

17 Claims, 6 Drawing Sheets

METHOD OF FABRICATING A SEMICONDUCTIVE DEVICE

BACKGROUND OF THE INVENTION

1. Field of the Invention

This invention relates to the fabrication process of an integrated circuit (IC). More particularly this invention relates to the fabrication process of a semiconductor device.

2. Description of the Related Art

Metal silicide has been receiving an increased attention in the IC industry, for its exceptional physical properties such as high melting point, stability, and low resistivity. As the density of integrated circuits increases in the deep sub-micron integrated circuit technology, the line width, the contact area and the junction depth have been substantially decreased. According to the prior art, depositing a metal silicide of the polysilicon gate electrode or at the junction of the source/drain region effectively improves the performance of the device, reduces the electrical resistance and the delay in the signal transmission due to the electrical resistance and capacitance (RC). As the gate electrode resistance and the junction resistance are being reduced, the driving current, the response time, or the operational speed of the circuitry for the entire device is improved.

Currently the most commonly used technology in the fabrication of integrated circuits is known as the self-aligned silicide (salicide) process. As shown in FIG. 1A, in the self-aligned silicide process, the polysilicon gate electrode 102 is patterned and a spacer 108 is formed along the sidewall of the gate electrode on a wafer 100. A metal layer 112 is then blanket-sputtered on the entire structure, followed by an annealing process. Silicide layers 114 and 116 are formed on the gate electrode 102 and on the junction such as the source/drain region. A wet etching process is used to remove the unreacted metal, to leave only the metal silicide 114 and 116 formed on the gate electrode 102 and the junction 110 as shown in FIG. 1B. Since this process of forming silicide 114 and 116 eliminates the need to pattern with photolithography, this technique is therefore known as the self-aligned silicide process.

As mentioned above, a higher integration for integrated circuits is normally accompanied by a reduction of the device dimensions. To decrease the resistance of the polysilicon gate electrode, the tip of the spacer 108 mentioned previously is made to be lower than the surface of the polysilicon gate electrode 102, so that a part of the sidewall of the polysilicon gate electrode 102 is exposed. The area of contact between the polysilicon gate electrode 102 and the metal layer 112 is therefore increased. Increasing the contact area between the polysilicon gate electrode and the metal layer proportionally increases the transformation of silicon on the polysilicon gate electrode 102 into metal silicide 114. The purpose of lowering the gate 102 resistance is achieved according to the conventional method.

As indicated in FIG. 2A, a spacer 108 is formed conventionally by first depositing a liner layer 104 on the substrate 100 after the formation the gate electrode 102 on the substrate, followed by depositing a silicon oxide layer 106 on the substrate 100. Subsequently, an anisotropic etching process is conducted to partially eliminate the silicon oxide layer 106 with the remaining silicon oxide layer surrounding the sidewall of the gate electrode 102 serving as a sidewall spacer 108, as shown in FIG. 2B. According to FIG. 3, in the process of creating the spacer, the tip of the spacer is overetched 302 and made to be lower than the gate electrode using an anisotropic dry etching process 300, such that a portion of the sidewall of the polysilicon gate electrode is exposed.

Since the thickness of the liner layer 104 is not uniform, using the above anisotropic dry etching process 106 to overetch the silicon oxide layer will inevitably induce damages to the liner layer, and resulted in pitting on the substrate 100 as indicated in 118 of FIG. 2B. Furthermore, while forming the spacer 108 using the dry etching process, the reactive ions rebound to a certain area on the substrate 100 after bombarding the spacer and form a microtrench 120 on the substrate 100. The depth of the microtrench 120 increases with the increased duration of the etching process. Therefore, to form a spacer by using an anisotropic dry etching procedure 106 to overetch the silicon oxide layer easily damages the substrate 100, and the reliability of the device is compromised.

SUMMARY OF THE INVENTION

Accordingly, the invention provides a fabricating method for a semiconductor device that increases the exposed gate surface area.

The invention provides a fabricating method for a semiconductor device that further prevents damaging to the substrate resulted from the over-etching while forming the spacer thereby compromising the reliability of the device.

The invention provides a fabricating method for a semiconductor device comprises the following steps. A liner layer and an insulation layer are deposited on the substrate after a gate electrode is formed on the substrate. An anisotropic etching process is performed to remove a portion of the insulation layer, such that the remaining insulation layer on the gate and on the sidewall is at the same height as the spacer. An anisotropic etching process is performed to remove a portion of the spacer, such that the height of the spacer is lower than the gate electrode and the exposed gate surface area is increased.

The material used in this invention for the spacer mentioned above includes silicon oxide. The etching gas used in the isotropic etching process in removing a portion of the spacer includes sulfur hexafluoride and trifluoroamine. Since the fluorine free radicals generated by the etching gas selectively etches the silicon oxide and the liner layer, the liner layer is retained to protect the substrate surface during the isotropic dry etching process. The problems of pitting and microtrench formation, which may compromise the reliability of the device, are prevented.

BRIEF DESCRIPTION OF THE DRAWINGS

The accompanying drawings illustrate presently preferred embodiments of the invention and together with the general description given above and the detailed description of the preferred embodiment given below, serve to explain the principles of the invention.

DESCRIPTION OF THE PREFERRED EMBODIMENTS

FIGS. 4A to 4F are the cross-sectional views showing a preferred embodiment of steps in fabricating a metal oxide semiconductor device according to the present invention.

Figure 1A:
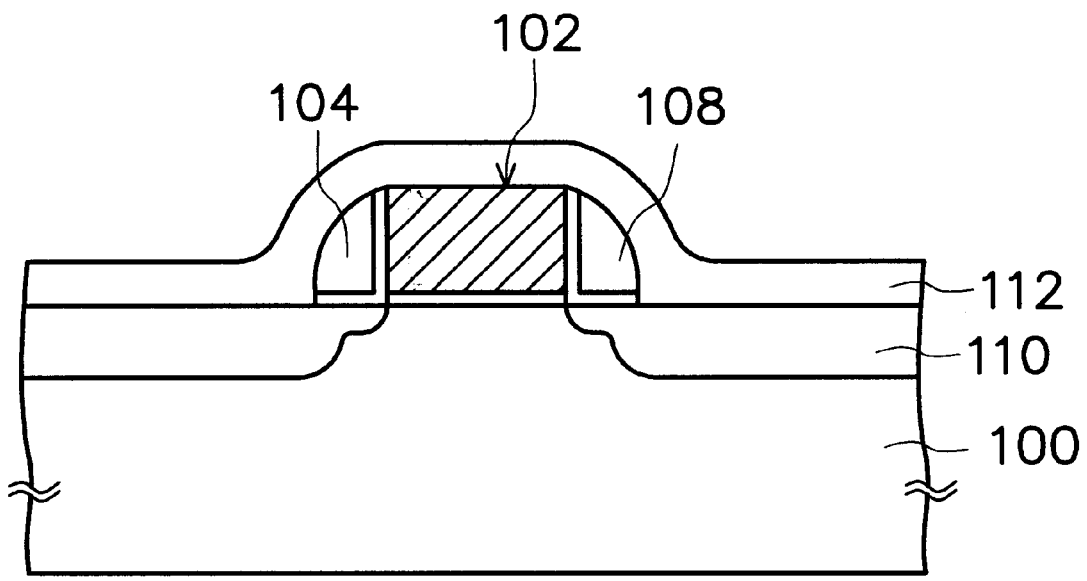
FIGS. 1A and 1B are cross-sectional views of a semiconductor device showing the progression of the conventional self-aligned silicide method.
Figure 1B:
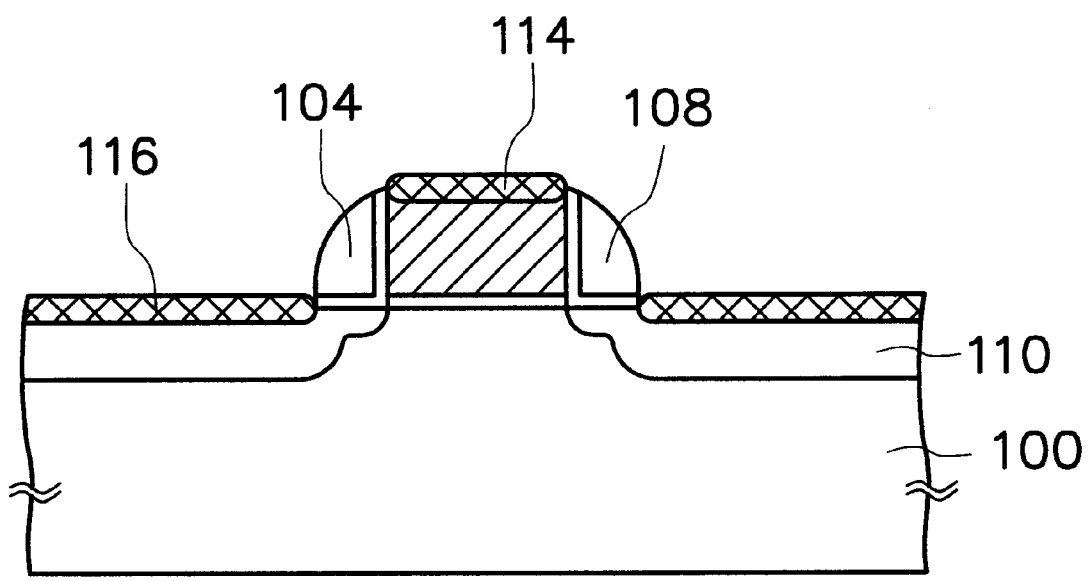
Figure 2A:
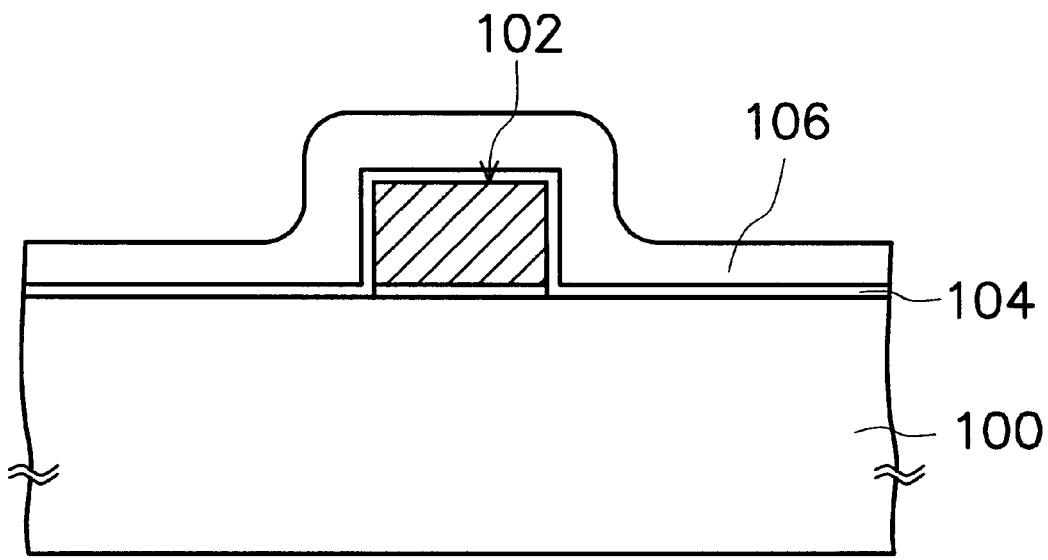
FIG. 2A and FIG. 2B are cross-sectional views of a semiconductor device showing the progression of manufacturing steps of a spacer according to the conventional method.
Figure 2B:
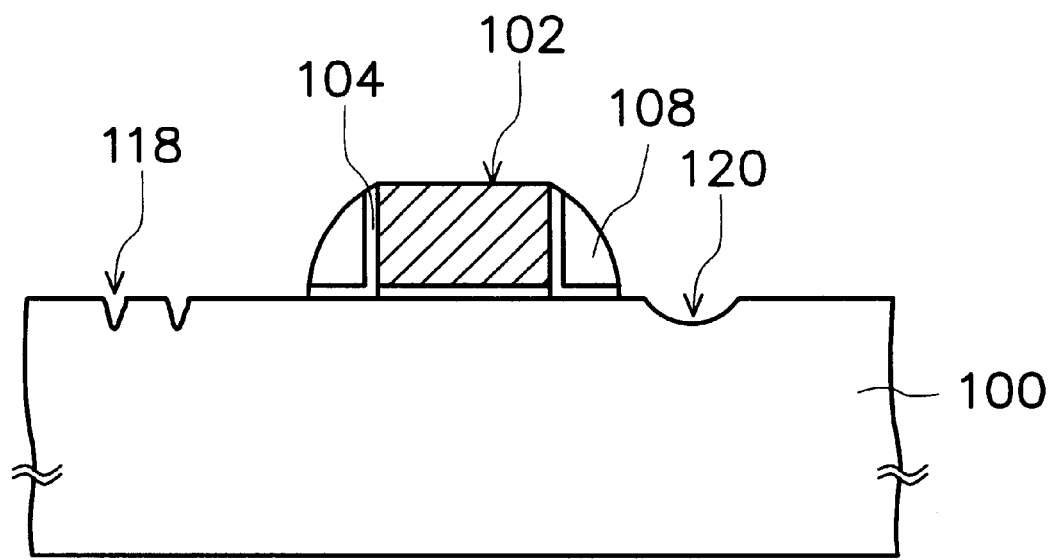
Figure 3:
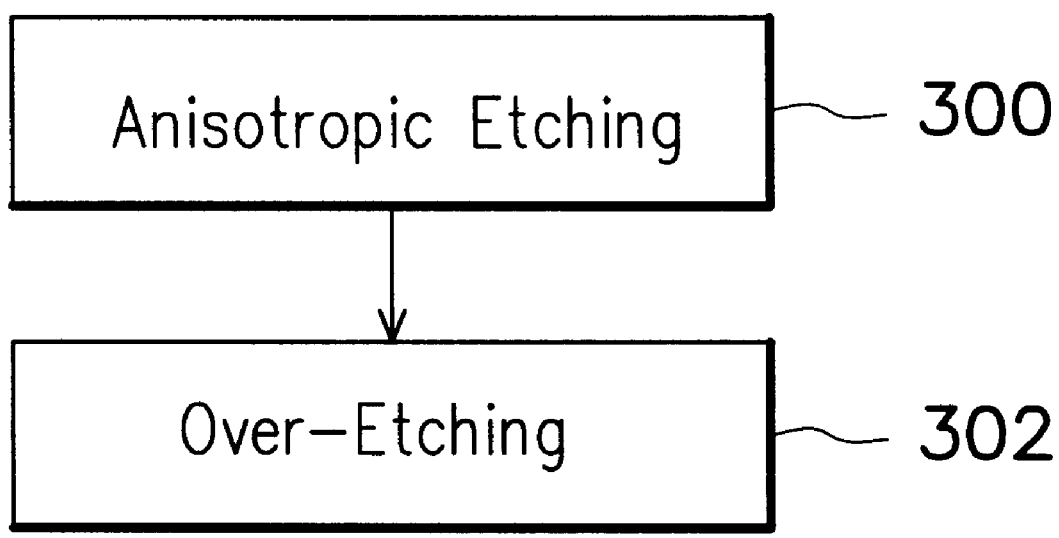
FIG. 3 is a graph showing the progression of an etching process in the production of the spacer in FIG. 2B.
Figure 4A:
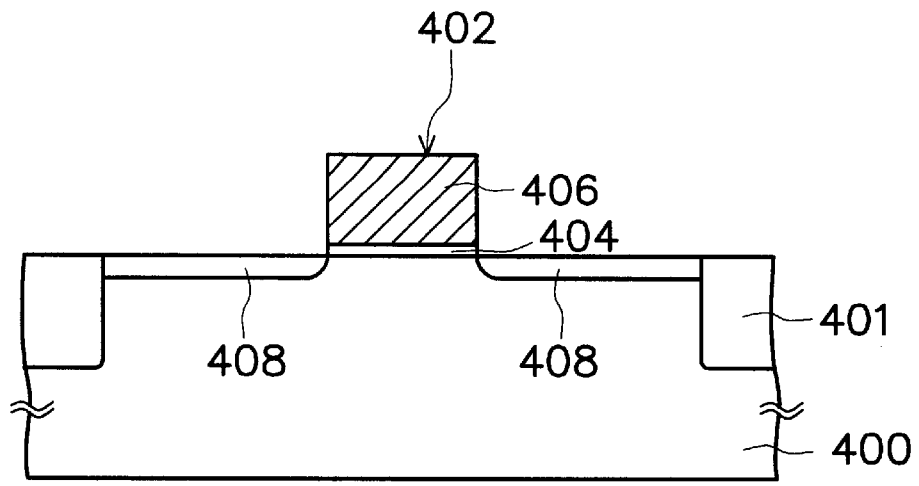
FIGS. 4A to 4F are a series of sectional views of a semiconductor device showing the progression of manufacturing steps according to the present invention.

As shown in FIG. 4A, an isolation region 401 is formed on the substrate 400. Reference numeral 400 depicts a p-type silicon substrate as an example. It is to be understood that additional advantages and modifications will be readily occur to those skilled in the art, for example, by interchanging the p-type silicon substrate by an n-type substrate. Consequently, the following conductive types of other components or devices are to be interchanged with the opposite conductive type thereof. Therefore, this invention is not limited to the specific details, represented devices, and illustrated examples shown described herein. The device isolation region 401 is formed, for example, by the shallow trench isolation method. A gate oxide layer 404 and a gate conductive layer 406 together form a gate electrode 402 on the substrate 400. The gate oxide layer 402 is approximately 30 Å to 50 Å in thickness, deposited by a thermal oxidation method or a chemical vapor deposition method. The gate conductive layer 406 comprises, for example, a polysilicon layer with a thickness of about 2500 Å, deposited by a chemical vapor deposition method. Using the gate electrode 402 and the isolation region 401 as a mask, an ion implantation is conducted to produce a lightly doped source/drain region 408 on the substrate 400. The implanted impurity includes the n-type phosphorus.

Figure 4B:
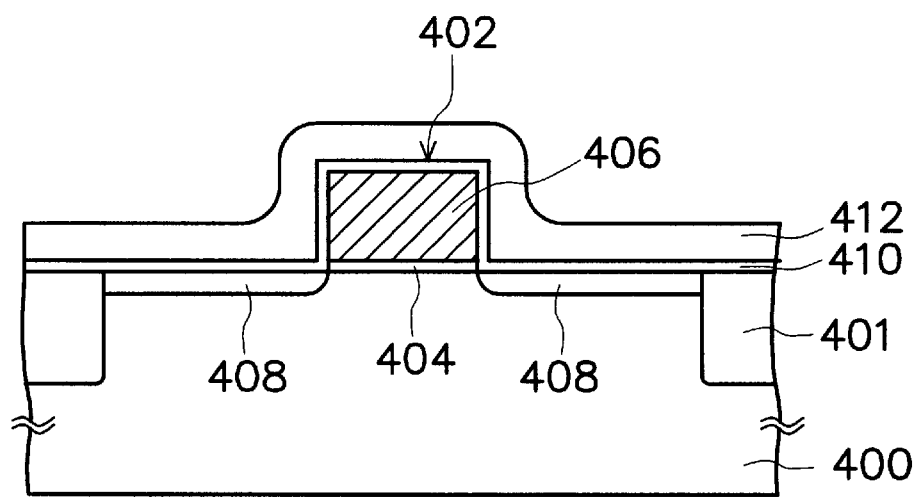

As illustrated in FIG. 4B, a liner layer 410 and an insulation layer 412 are deposited on the substrate 400. The liner layer 410 is used to protect the substrate 400 during the anisotropic etching of the insulation layer, and to minimize the stress between the insulation layer 412 and the gate 402. Hence, the liner layer 410, made of silicon oxide, for example, possesses a different etching rate from the insulation layer 412, and is deposited by methods, such as the low pressure chemical vapor deposition method. The insulation layer 412 is made of, for example, silicon nitride or silicon nitric oxide, and is deposited by methods, such as the chemical vapor deposition method.

Figure 4C:
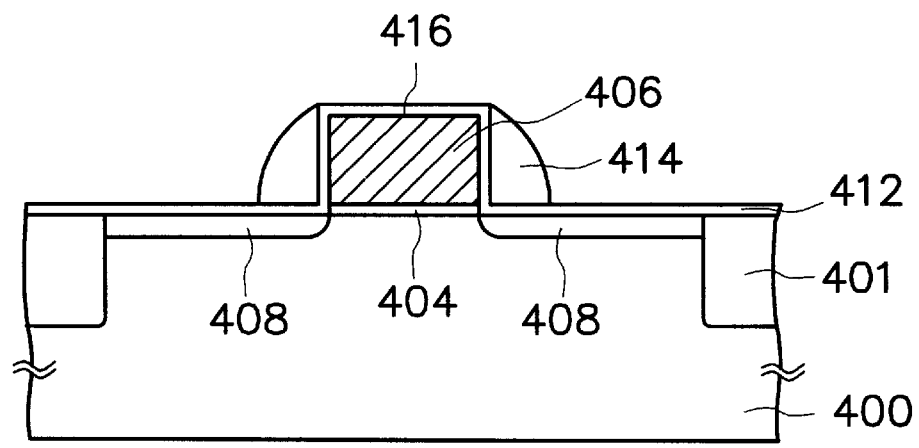
Figure 5:
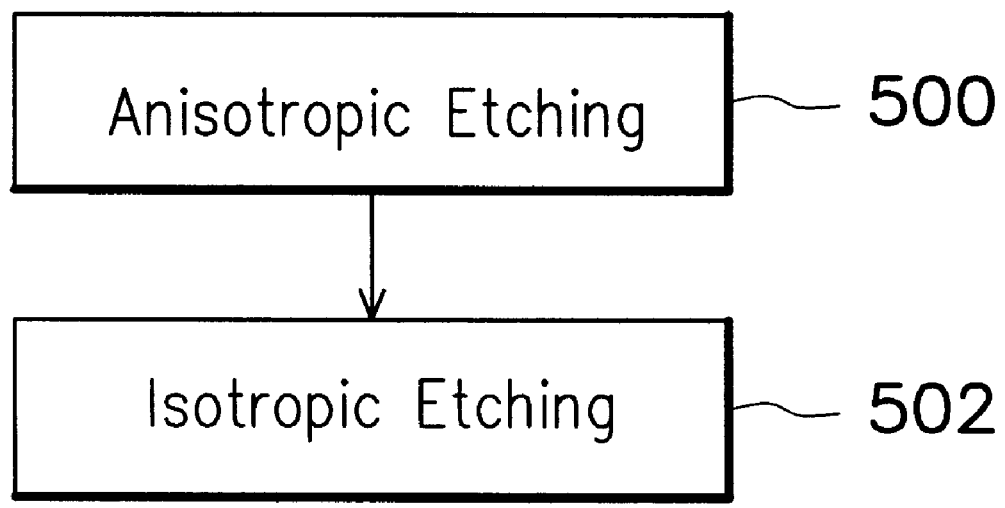
FIG. 5 is a graph showing the progression of an etching process in the production of the spacer in FIGS. 4A to 4F.

As illustrated in FIGS. 4C and 5, an anisotropic etching process 500 is conducted, using the liner layer 410 as an etching stop layer, to remove the insulation layer 412 to form a spacer 414 with the remaining insulation layer 412 surrounding the sidewall of the gate 402. The tip of the spacer 414 is at a same height as the upper surface 416 of the liner layer 410. The anisotropic etching process 500, such as a dry etching process, is preferably proceeded in two steps of etching. The first etching step uses etching gases such as trifluoromethane and argon. The second etching step uses etching gases such as monofluoro methane and oxygen.

Figure 4D:
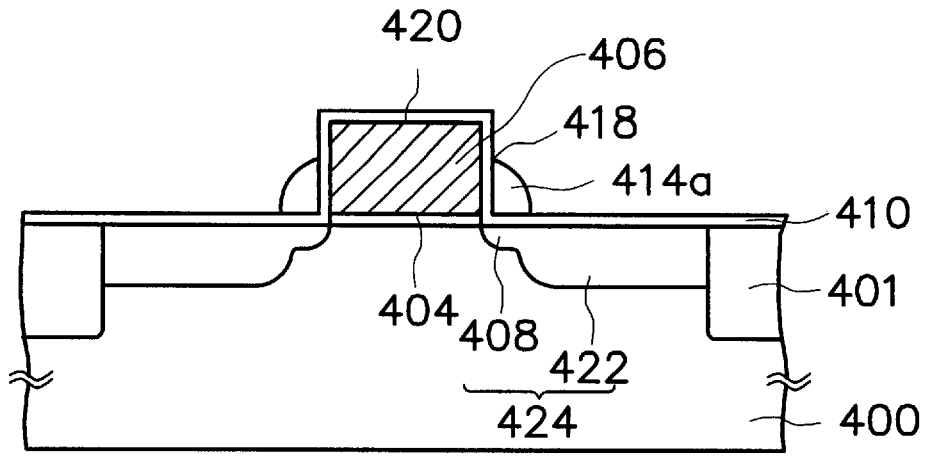

FIGS. 4D and 5 depict an isotropic dry etching process 502 to etch away a portion of the spacer 414, so that the height of the tip 418 of the remaining spacer 414a is lower than the height of the upper surface 420 of the gate electrode 402. The liner layer 410 is served as an etching stop layer in the above isotropic etching process. The tip 418 of the spacer 414a is approximately 400 to 500Å below the upper surface 420 of the gate electrode 402. The thickness of the spacer 414a is about 700 to 850 Å. The etching gases for the isotropic dry etching process 502 are those that generate the fluorine free radicals, such as sulfur hexafluoride ($SF_6$) or trifluoroamine ($NF_3$). Since the fluorine free radicals generated from the etching gas, selectively etch the silicon nitride and the liner layer 410, the liner layer 410 is therefore retained to protect the surface of the substrate 400 in the etching of the spacer 414 using the isotropic dry etching process 502. As a result, the problems of pitting and microtrench formations on the substrate, which may affect the reliability of the device, are prevented.

Using the gate electrode 402 and the isolation region 401 as masks, an ion implantation is conducted to form a heavily doped source/drain region 422 on the substrate 400. The heavily doped source/drain region 422 combines with the previously formed lightly doped source/drain region to form a source/drain region 424. The implanted ions include the n-type phosphorus or arsenic. Since, according to the fabrication method of this invention, the spacer 414 maintains a thickness of between 700 Å and 850 Å, the lightly doped source/drain region 408 thus retains a certain channel width to prevent the hot carrier effect.

Figure 4E:
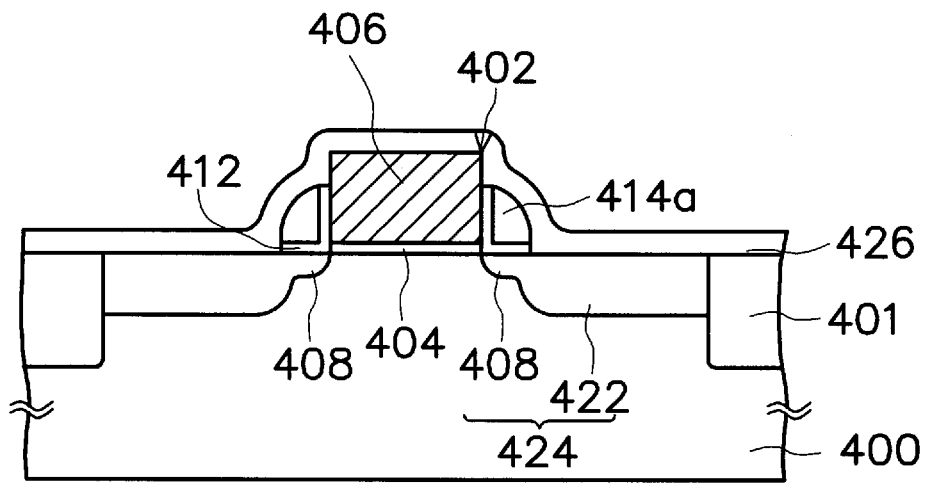

FIG. 4E shows the removal of a portion of the liner layer 412 in order to expose the surface of the conductive layer 404 of the gate 402 and the surface of the substrate 400. The method used to remove the liner layer 412 is, for example, a wet etching procedure. The etching solutions are, for example, hydrofluoric acid. Furthermore, the substrate 400 is covered with a metal layer 426 to form a self-aligned metal silicide. The materials that are preferred for the metal layer 426 include heat resistance metals such as titanium, tungsten, cobalt, nickel, platinum or palladium. The metal layer is deposited by means of, for example, a chemical vapor deposition method or a physical vapor deposition method.

Figure 4F:
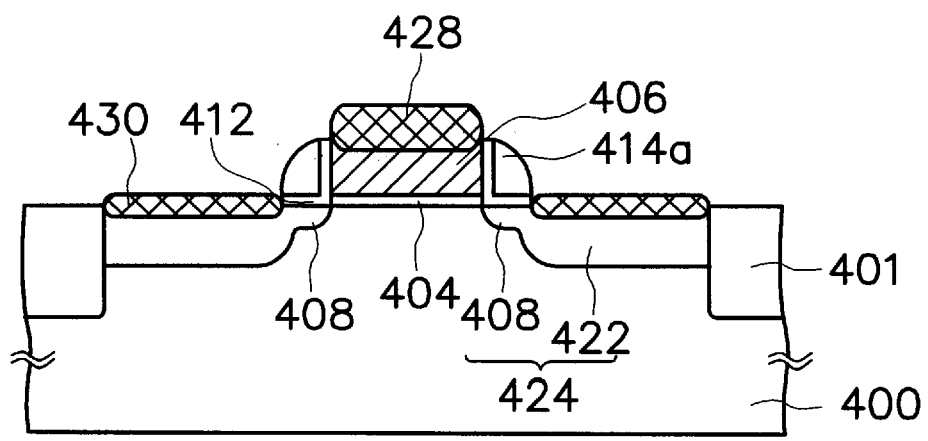

As shown in FIG. 4F, the annealing process induces a formation of a metal silicide 428 and 430 from the metal layer 426 to cover the conductive layer 404 and the source/drain region 424. The unreacted metal layer 426 is etched away, preferably by a selective wet etching process. If titanium is used for the metal layer 426, the annealing temperature is preferred to be 800 degree Celsius, and the preferred etching liquids are aqueous solutions of hydrogen peroxide ($H_2O_2$) and ammonium hydroxide ($NH_4OH$).

Since the height at the tip 418 of the spacer 414a is lower than the upper surface 420 of the gate electrode 402, more surface area of the gate conductive layer 404 is exposed. The volume of the metal silicide 428 formed with the metal layer 426 is hence greatly increased. The resistance of the entire gate electrode 402 is thereby lowered.

The advantages of the current invention are summarized as follow. This invention increases the exposed surface area of the gate electrode by removing a portion of the spacer. This invention allows the spacer to maintain a certain thickness by selectively removing the silicon nitride and retaining the liner layer to protect the substrate surface. This invention allows the lightly doped source/drain region to maintain a certain width by maintaining the spacer of a certain thickness, therefore preventing the hot carrier effect. This invention increases the volume of the self-aligned metal silicide by exposing a greater area of the gate conductive layer, therefore effectively lower the resistance of the gate electrode.

Additional advantages and modifications will readily occurs to those skilled in the art from consideration of the specification and practice of the invention disclosed herein. It is intended that the specification and examples to be considered as exemplary only, with a true scope and spirit of the invention being indicated by the following claims.

What is claimed is:

1. A fabricating method of a semiconductor device comprising the steps of:

forming a gate electrode on a substrate;

forming a liner layer on the substrate and the gate electrode;

forming an insulation layer on the liner layer;

anisotropically etching the insulation layer to form a spacer surrounding a sidewall of the gate electrode such that a tip of the spacer is at a same height as a surface of the liner layer over the gate electrode, wherein the anisotropic etching process comprises of two steps, the first step uses gases selected from a group consisting of trifluoro methane and argon, and the second step uses gases selected from a group consisting of monofluro methane and oxygen; and performing an isotropic dry etching process to remove a portion of the spacer, such that the tip of the spacer is lower than the liner layer over the gate electrode.

2. The fabrication method of a semiconductor device according to claim 1, wherein the spacer is formed with silicon nitride.

3. The fabrication method of a semiconductor device according to claim 1 wherein the etching gases used in the anisotropic etching process produces fluorine free radicals.

4. The fabrication method of a semiconductor device according to claim 3, wherein the etching gases include sulfur hexafluoride ($SF_6$).

5. The fabrication method of a semiconductor device according to claim 3, wherein the etching gases include trifluoroamine ($NF_3$).

6. The fabrication method of a semiconductor device according to claim 1 wherein the etching gases used in the isotropic dry etching process produces fluorine free radicals.

7. A method of fabricating a semiconductor device, comprising:

forming a polysilicon layer on a substrate;

forming a liner layer on the substrate and the polysilicon layer;

forming an insulation layer on the liner layer;

anisotropically etching the insulation layer to form a spacer surrounding a sidewall of the polysilicon layer such that a tip of the spacer is at a same height of a surface of the liner layer and the polysilicon layer, wherein the anisotropic etching process comprises of two steps, the first step uses gases selected from a group consisting of trifluoro methane and argon, and the second step uses gases selected from a group consisting of monofluro methane and oxygen;

conducting an isotropic dry etching process to remove a portion of the spacer such that the tip of the spacer is lower than the surface of the polysilicon layer; and forming a self-aligned metal silicide on an exposed surface area of the polysilicon layer.

8. The fabrication method of a semiconductor device according to claim 7, wherein the spacer is formed with silicon nitride.

9. The fabrication method of a semiconductor device according to claim 7, wherein the etching process gas used in the anisotropic etching process generates fluorine free radicals.

10. The fabrication method of a semiconductor device according to claim 9 wherein the etching gas includes sulfur hexafluoride ($SF_6$).

11. The fabrication method of a semiconductor device according to claim 9 wherein the etching gas includes trifluoroamine ($NF_3$).

12. The fabrication method of a semiconductor device according to claim 7 wherein the etching gas used in the isotropic etching process generates fluorine free radicals.

13. A method of fabricating a semiconductor device, comprising:

forming a gate electrode on a substrate;

forming a lightly doped source/drain region on the substrate;

forming a liner layer on the substrate;

forming an insulation layer on the liner layer;

anisotropically etching the insulation layer to form a spacer surrounding a sidewall of the gate electrode such that a tip of the spacer is at a same height as a surface of the liner layer, wherein the anisotropic etching process comprises of two steps, the first step uses gases selected from a group consisting of trifluoro methane and argon, and the second step uses gases selected from a group consisting of monofluro methane and oxygen;

conducting an isotropic dry etching process to remove a portion of the said spacer, such that the tip of the spacer is lower than a gate surface;

forming a heavily doped source/drain region and combining with a lightly doped source/drain region to become a source/drain region; and forming a self-aligned metal silicide on an exposed surface area of the gate and on the source/drain region.

14. The fabrication method of a semiconductor device according to claim 13, wherein the spacer is formed with silicon nitride.

15. The fabrication method of a semiconductor device according to claim 13, wherein the etching gas used in the isotropic etching process generates fluorine free radicals.

16. The fabrication method of a semiconductor device according to claim 15, wherein the etching gas includes sulfur hexafluoride ($SF_6$) and trifluoroamine ($NF_3$).

17. The fabrication method of a semiconductor device according to claim 13, wherein the etching gas used in the anisotropic etching process generates fluorine free radicals.

* * * * *